(12) United States Patent
Iriyama

(10) Patent No.: US 9,647,322 B2
(45) Date of Patent: May 9, 2017

(54) STRUCTURAL BODY AND WIRELESS COMMUNICATION APPARATUS

(71) Applicant: SHARP KABUSHIKI KAISHA, Osaka-shi, Osaka (JP)

(72) Inventor: Akihiro Iriyama, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 39 days.

(21) Appl. No.: 14/433,759

(22) PCT Filed: Jan. 16, 2014

(86) PCT No.: PCT/JP2014/050677
§ 371 (c)(1),
(2) Date: Apr. 6, 2015

(87) PCT Pub. No.: WO2014/148075
PCT Pub. Date: Sep. 25, 2014

(65) Prior Publication Data
US 2015/0249284 A1    Sep. 3, 2015

(30) Foreign Application Priority Data

Mar. 21, 2013  (JP) ................................ 2013-059151

(51) Int. Cl.
*H01Q 1/24* (2006.01)
*H05K 1/02* (2006.01)
*H05K 1/16* (2006.01)

(52) U.S. Cl.
CPC .......... *H01Q 1/243* (2013.01); *H05K 1/0296* (2013.01); *H05K 1/165* (2013.01); *H05K 2201/09045* (2013.01); *H05K 2201/0999* (2013.01); *H05K 2201/09263* (2013.01); *H05K 2201/10098* (2013.01); *H05K 2201/10265* (2013.01); *H05K 2201/2072* (2013.01)

(58) Field of Classification Search
CPC ...... H01Q 1/22; H01Q 1/2216; H01Q 1/2225; H01Q 1/2266; H01Q 1/2275; H01Q 1/24; H01Q 1/241; H01Q 1/243; H01Q 1/40; H01Q 1/405; H01Q 1/2258; H01Q 1/2291; H01Q 1/242
USPC .......................................... 343/702, 872, 873
See application file for complete search history.

(56) References Cited

U.S. PATENT DOCUMENTS

| | | | | |
|---|---|---|---|---|
| 8,120,539 B2* | 2/2012 | Hong | ................... | H01Q 1/1207 343/702 |
| 8,289,216 B2* | 10/2012 | Cho | ................... | B29C 45/1671 343/702 |
| 8,654,029 B2* | 2/2014 | Fan | ................... | H01Q 1/42 29/600 |
| 8,760,351 B2* | 6/2014 | Ma | ................... | B29C 45/1671 343/702 |

(Continued)

FOREIGN PATENT DOCUMENTS

WO    WO 2010/098540 A2    9/2010

*Primary Examiner* — David G Phan
*Assistant Examiner* — Patrick Holecek
(74) *Attorney, Agent, or Firm* — Birch, Stewart, Kolasch & Birch, LLP

(57) ABSTRACT

A first resin layer is provided with a step part formed in conformity with a shape of at least part of an electrically conductive pattern, and the first resin layer and a second resin layer closely adhere to each other in the step part.

2 Claims, 6 Drawing Sheets

(56) References Cited

U.S. PATENT DOCUMENTS

| | | | |
|---|---|---|---|
| 8,933,844 B2* | 1/2015 | Hong | B29C 45/14065 |
| | | | 343/700 MS |
| 8,982,009 B2* | 3/2015 | Sung | H01Q 1/243 |
| | | | 343/702 |
| 9,425,501 B2* | 8/2016 | Desclos | H01P 11/003 |
| 2009/0015490 A1* | 1/2009 | Honda | H01Q 1/243 |
| | | | 343/702 |
| 2011/0316759 A1 | 12/2011 | Fan et al. | |
| 2012/0206303 A1* | 8/2012 | Desclos | H01Q 1/243 |
| | | | 343/702 |
| 2014/0009363 A1* | 1/2014 | Takeuchi | H01Q 1/40 |
| | | | 343/872 |

* cited by examiner

STRUCTURAL BODY AND WIRELESS COMMUNICATION APPARATUS

TECHNICAL FIELD

The present invention relates to a structure including an electrically conductive pattern, and to a wireless communication apparatus including the structure.

BACKGROUND ART

In order to make an electronic device thinner and cause the electronic device to have a simpler structure, there has recently been developed a technique for integrally molding an electrically conductive pattern with a housing (Patent Literature 1).

Patent Literature 1 discloses a housing including a first injection layer, a second injection layer stacked on the first injection layer, an antenna radiator stacked on the second injection layer, and an outer layer stacked on the antenna radiator.

According to the technique disclosed in Patent Literature 1, the second injection layer is formed on a part of the first injection layer, the antenna radiator is formed on the second injection layer, and thereafter the outer layer is formed so as to cover an exposed part of the first injection layer and the antenna radiator.

CITATION LIST

Patent Literature

Patent Literature 1
Specification of U.S. Patent Application Publication No. 2011/0316759 (Publication Date: Dec. 29, 2011)

SUMMARY OF INVENTION

Technical Problem

The technique disclosed in Patent Literature 1 has the following problem. During the forming of the outer layer, in the exposed part of the first injection layer, the outer layer and the first injection layer melt together and closely adhere to each other (are welded together) favorably. However, the outer layer and the antenna radiator do not melt together in a part in which the antenna radiator is provided. Therefore, the antenna radiator and the outer layer, which are low in adhesion strength, may be separated from each other at an interface therebetween.

The present invention has been made in view of the problem, and a main object of the present invention is to provide a technique for, in a structure including a first resin layer, an electrically conductive pattern provided on the first resin layer, and a second resin layer provided on the electrically conductive pattern, preventing separation of the electrically conductive pattern and the second resin layer at an interface therebetween.

Solution to Problem

A structure in accordance with an aspect of the present invention having a first resin layer and a second resin layer, includes: an electrically conductive pattern provided on a surface of the first resin layer, the second resin layer being provided on the first layer so that the electrically conductive pattern is provided between the first resin layer and the second resin layer, the first resin layer being provided with a step part formed in conformity with a shape of at least part of the electrically conductive pattern, and the first resin layer and the second resin layer closely adhering to each other in the step part.

Additional objects, features, and strengths of the present invention will be made clear by the description below. Further, the advantages of the present invention will be evident from the following explanation in reference to the drawings.

Advantageous Effects of Invention

According to a structure in accordance with an aspect of the present invention, since a step part is provided in conformity with an electrically conductive pattern, an area of contact between a first resin layer and a second resin layer around the electrically conductive pattern is made larger. As a result, the first resin layer and the second resin layer increase in adhesion strength around the electrically conductive pattern. This can prevent separation of the second resin layer and the electrically conductive pattern at an interface therebetween.

Figure 2:
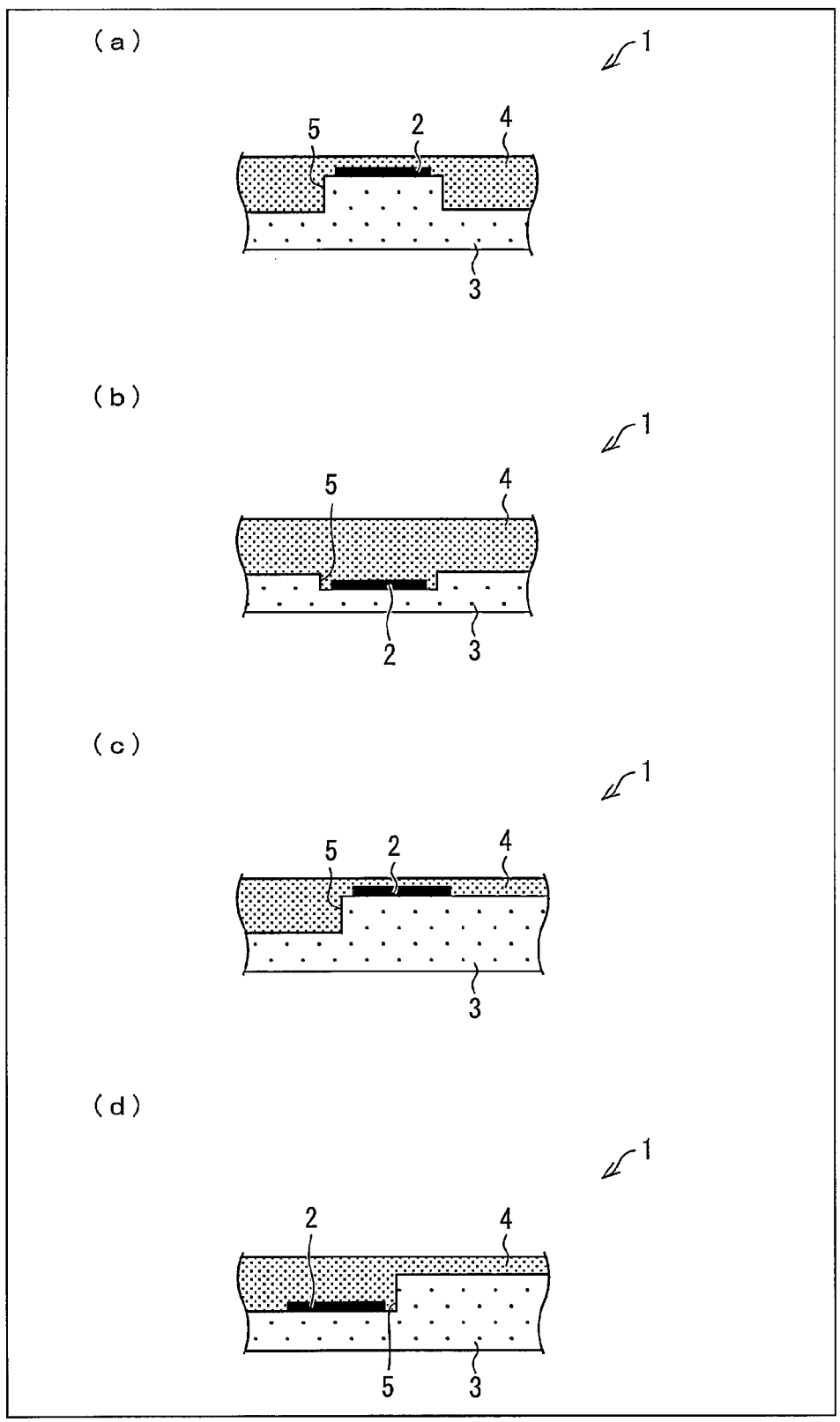

(a) through (d) of FIG. 2 illustrate variations of a cross section of a structure in accordance with an embodiment of the present invention.

Figure 3:
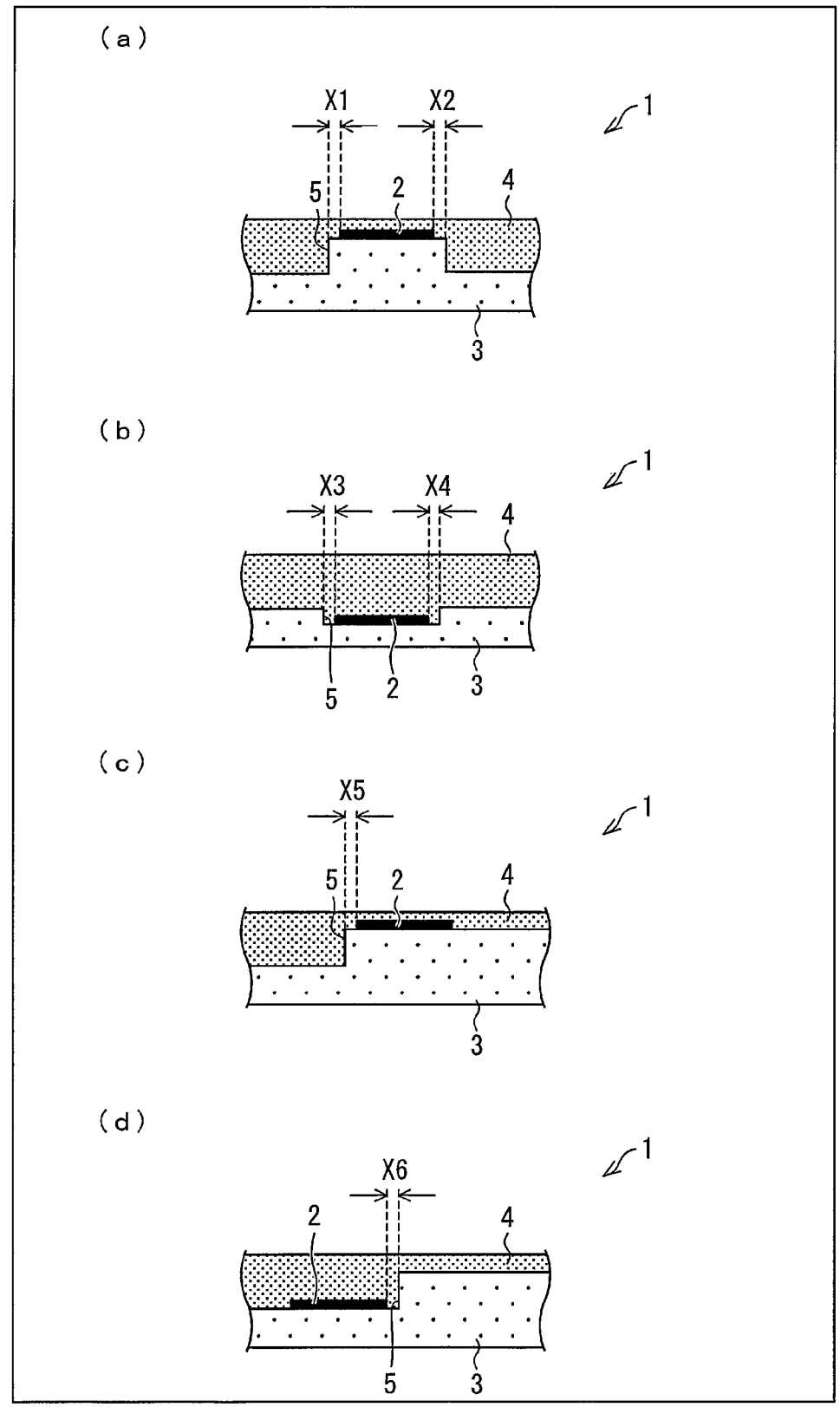

(a) through (d) of FIG. 3 illustrate variations of a cross section of a structure in accordance with an embodiment of the present invention.

Figure 4:
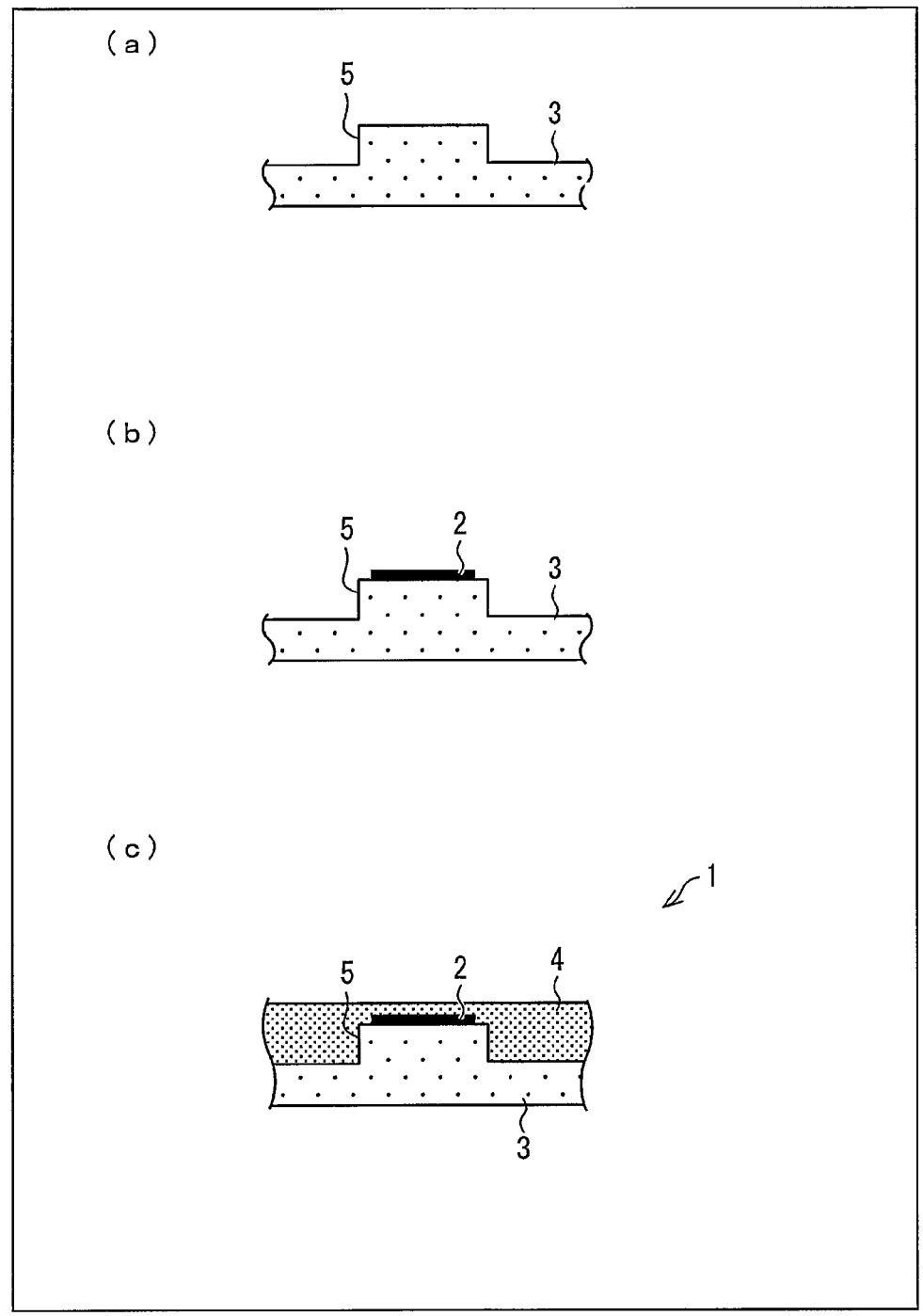

(a) through (c) of FIG. 4 schematically illustrate a process for producing a structure in accordance with an embodiment of the present invention.

Figure 5:
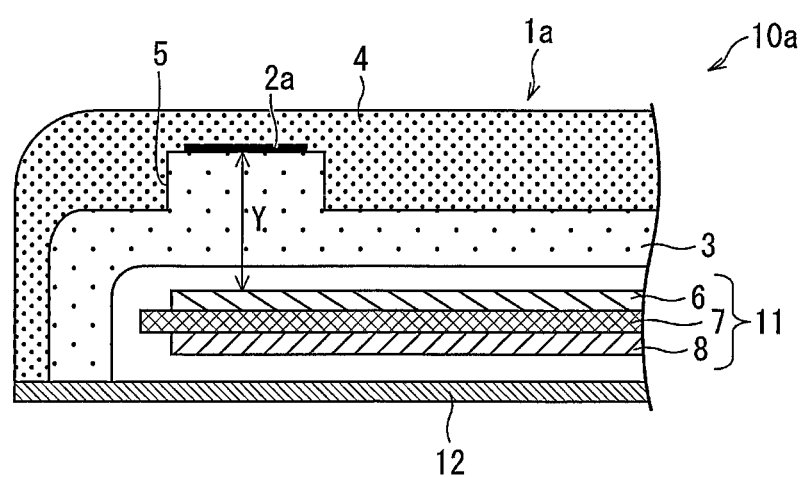

FIG. 5 schematically illustrates a cross section of a wireless communication apparatus in accordance with an embodiment of the present invention.

Figure 6:
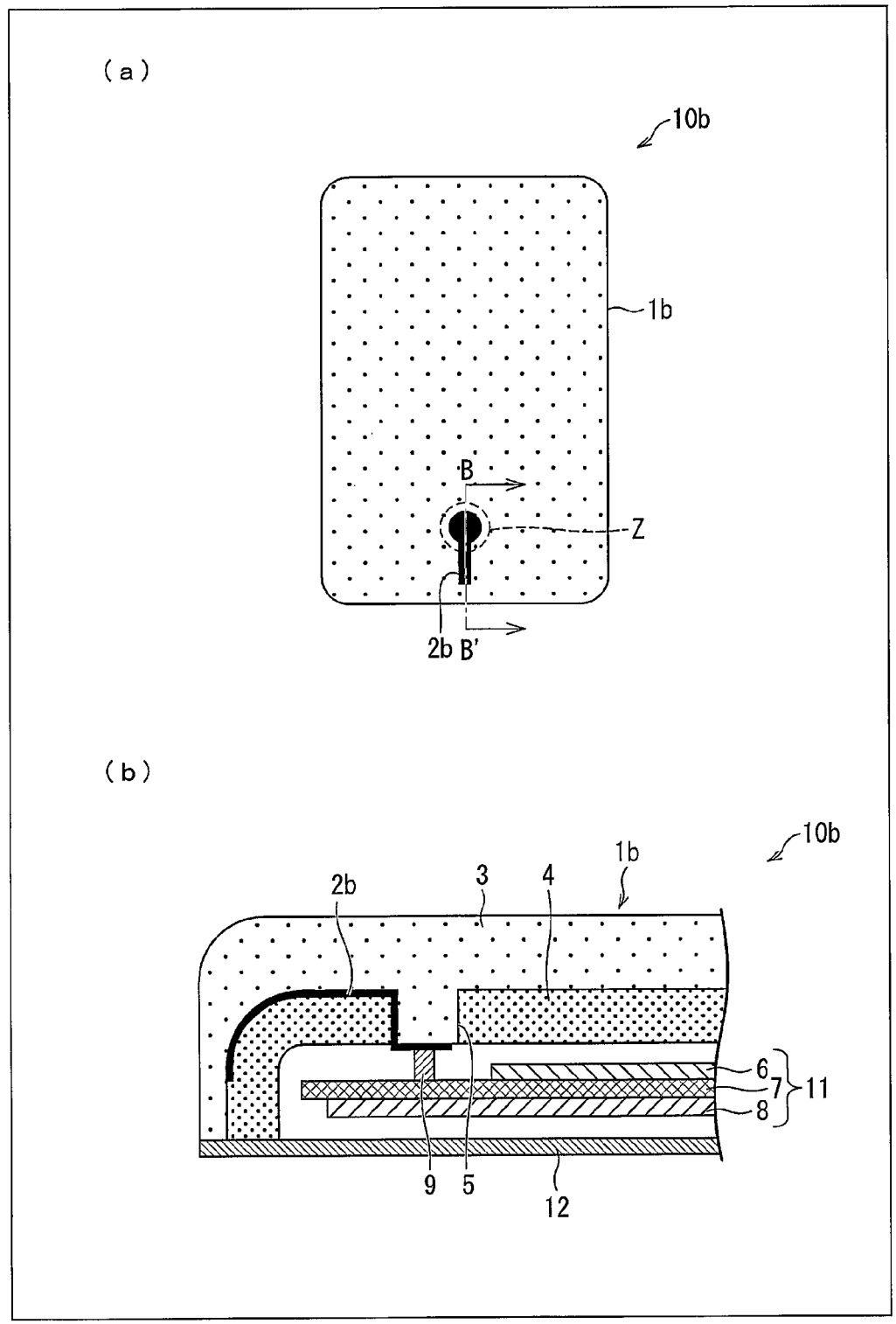

FIG. 6 schematically illustrates a configuration of a wireless communication apparatus in accordance with an embodiment of the present invention. (a) of FIG. 6 illustrates a cross section of an electronic device which cross section is taken along a surface on which an electrically conductive pattern is formed. (b) of FIG. 6 illustrates a cross section viewed along arrows B-B' in (a) of FIG. 6.

DESCRIPTION OF EMBODIMENTS

A structure in accordance with the present invention having a first resin layer and a second resin layer, includes: an electrically conductive pattern provided on a surface of the first resin layer, the second resin layer being provided on the first layer so that the electrically conductive pattern is provided between the first resin layer and the second resin layer, the first resin layer being provided with a step part formed in conformity with a shape of at least part of the electrically conductive pattern, and the first resin layer and the second resin layer closely adhering to each other in the step part.

A wireless communication apparatus in accordance with the present invention includes: a housing including the structure in accordance with the present invention; and an antenna including the electrically conductive pattern.

(Brief Description of Structure)

A structure in accordance with the present invention provides a general electronic device with an electrically conductive pattern by being incorporated in the general electronic device that requires the electrically conductive pattern serving as, for example, an antenna element, a signal transmission path, or an electric power transmission path. For example, according to an embodiment of the present invention, the structure in accordance with the present invention is incorporated in an antenna device so as to provide an antenna element to be provided in the antenna device. Alternatively, the structure in accordance with the present invention can be incorporated in an electronic device so as to provide, for example, a signal transmission path or an electric power transmission path that electrically connects a circuit board and another electronic component, or to provide a path that connects a circuit board and a ground.

Note that the structure in accordance with the present invention can be fixed to or detachably mounted in an electronic device. Note also that according to an embodiment of the present invention, the structure in accordance with the present invention can constitute at least part of a housing of an electronic device. In other words, the structure in accordance with the present invention can be an electrically conductive pattern-formed housing. Note that a housing refers to a member storing an electronic component of an electronic device and that an electrically conductive pattern-formed housing refers to a housing in which an electrically conductive pattern is provided. Note, however, that the structure in accordance with the present invention, which structure is not limited to such a structure as described above, can be a member different from a housing of an electronic device.

According to the structure in accordance with the present invention, the electrically conductive pattern, which is provided between the first resin layer and the second resin layer, can prevent exposure of the electrically conductive pattern to an outside of the structure. This makes it possible to maintain a fine appearance of the structure, and to prevent, for example, breakage, deformation, or deterioration in the electrically conductive pattern.

The first resin layer and the second resin layer are both injection-molded articles. The first resin layer and the second resin layer can be made of a single resin or different resins. A usable resin(s) of which the first resin layer and the second resin layer is made is exemplified by, but not limited to one or more kinds of resins selected from, for example, acrylonitrile-butadiene-styrene resin (ABS), polycarbonate-acrylonitrile-butadiene-styrene resin (PC-ABS), polycarbonate (PC), acrylonitrile-styrene resin (AS), polyethylene (PE), polypropylene (PP), polystyrene (PS), and methylmethacrylate resin (PMMA). Note that it is possible to mix such a resin as described above and another material such as glass so as to cause the first resin layer and the second resin layer to have a higher strength.

Further, in an aspect of the present invention, it is possible to use, as a resin of which the first resin layer is made, a resin that is more resistant to heat than a resin of which the second resin layer is made. This can prevent the resins of which the first resin layer and the second resin layer are made from excessively melting together during forming of the second resin layer. For example, PC can be used as the resin of which the first resin layer is made, and ABS can be used as the resin of which the second resin layer is made.

The electrically conductive pattern is a pattern made of an electrically conductive material provided on a surface of the first resin layer. The electrically conductive material is not particularly limited in kind provided that the electrically conductive material is electrically conductive. Examples of a usable electrically conductive material include: metals such as copper, iron, nickel, and gold; an electrically conductive polymer; and electrically conductive carbon. A method for forming the electrically conductive pattern is not particularly limited. The electrically conductive pattern can be formed by, for example, plating the first resin layer with metal, printing, on the surface of the first resin layer, electrically conductive paste containing the electrically conductive material, or pasting, on the surface of the first resin layer, a filmy electrically conductive material having flexibility such as copper foil. The electrically conductive material for use in forming of the electrically conductive pattern is not limited to one kind of electrically conductive material. The electrically conductive pattern can be formed by combining a plurality of electrically conductive materials, e.g., by plating a copper pattern with gold.

For example, according to an embodiment of the present invention, the electrically conductive pattern can be formed by a Laser Direct Structuring (LDS) method. That is, an organic metal is mixed with a resin of which the first resin layer is made, and a region of the surface of the first resin layer in which region the electrically conductive pattern is to be formed is irradiated with a laser. This makes it possible to suitably form the electrically conductive pattern by precipitating the organic metal to the region irradiated with a laser, making the region irradiated with a laser finely rough (uneven), and combining the organic metal and the region irradiated with a laser. According to another embodiment of the present invention, the electrically conductive pattern can be formed by a Direct Printed Antenna (DPA) method. The DPA method is a method in which a printing plate for forming the electrically conductive pattern is prepared in advance and a shape of the electrically conductive pattern is transferred from the printing plate to a resin surface by use of, for example, a pad.

According to the methods described earlier (especially the LDS method), since the electrically conductive pattern is formed on the surface of the first resin layer by laser irradiation, the first resin layer and the electrically conductive pattern considerably more closely adhere to each other.

Further, according to the structure in accordance with the present invention, the first resin layer is provided with a step part formed in conformity with a shape of at least part of the electrically conductive pattern, and the first resin layer and the second resin layer closely adhere to each other in the step part. This allows an increase in area of contact between the first resin layer and the second resin layer around the electrically conductive pattern. As a result, the first resin layer and the second resin layer increase in adhesion strength around the electrically conductive pattern. This can prevent separation of the second resin layer and the electrically conductive pattern at an interface therebetween.

Note that "a step part formed in conformity with a shape of at least part of the electrically conductive pattern" herein indicates that in conformity with a contour shape of at least part of the electrically conductive pattern (hereinafter referred to as an electrically conductive pattern A), a step (including a step either protruding or recessed from a surface on which the electrically conductive pattern A is provided) is provided. Note also that the step can be provided so as to be in contact with a contour of the electrically conductive pattern A, or can be provided at a given distance from the contour of electrically conductive pattern A. Note also that "the first resin layer and the second resin layer closely adhere to each other in the step part" indicates that the second resin layer is provided with a step corresponding to the step of the first resin layer, and the first resin layer and the second resin layer closely adhere to each other on side walls of the steps.

For example, the structure in accordance with the present invention can be produced as below. First, the first resin layer is formed in a desired shape by use of a publicly-known injection molding technique (a first resin layer forming step). Next, the electrically conductive pattern is formed on the surface of the first resin layer by use of the method described earlier (an electrically conductive pattern forming step). In this case, the step part is provided on the first resin layer in advance in the first resin layer forming step so that the step part is provided in conformity with the shape of at least part of the electrically conductive pattern after the electrically conductive pattern forming step.

Thereafter, the second resin layer is stacked on the first resin layer so that the electrically conductive pattern is provided between the first resin layer and the second resin layer (a stacking step). In the stacking step, the second resin layer is integrally insert-molded with the first resin layer, which has already been formed. That is, by molding (insert-molding) the second resin layer while the first resin layer is provided in a mold, the first resin layer and the second resin layer can closely adhere (are attached) to each other favorably in a region in which the electrically conductive pattern including the step is absent.

Subsequently, several embodiments of the present invention are specifically described below with reference to the drawings. Note that in the following description of the embodiments, members having identical functions and operations are given respective identical reference numerals, and a description of those members is omitted.

First Embodiment

Figure 1:
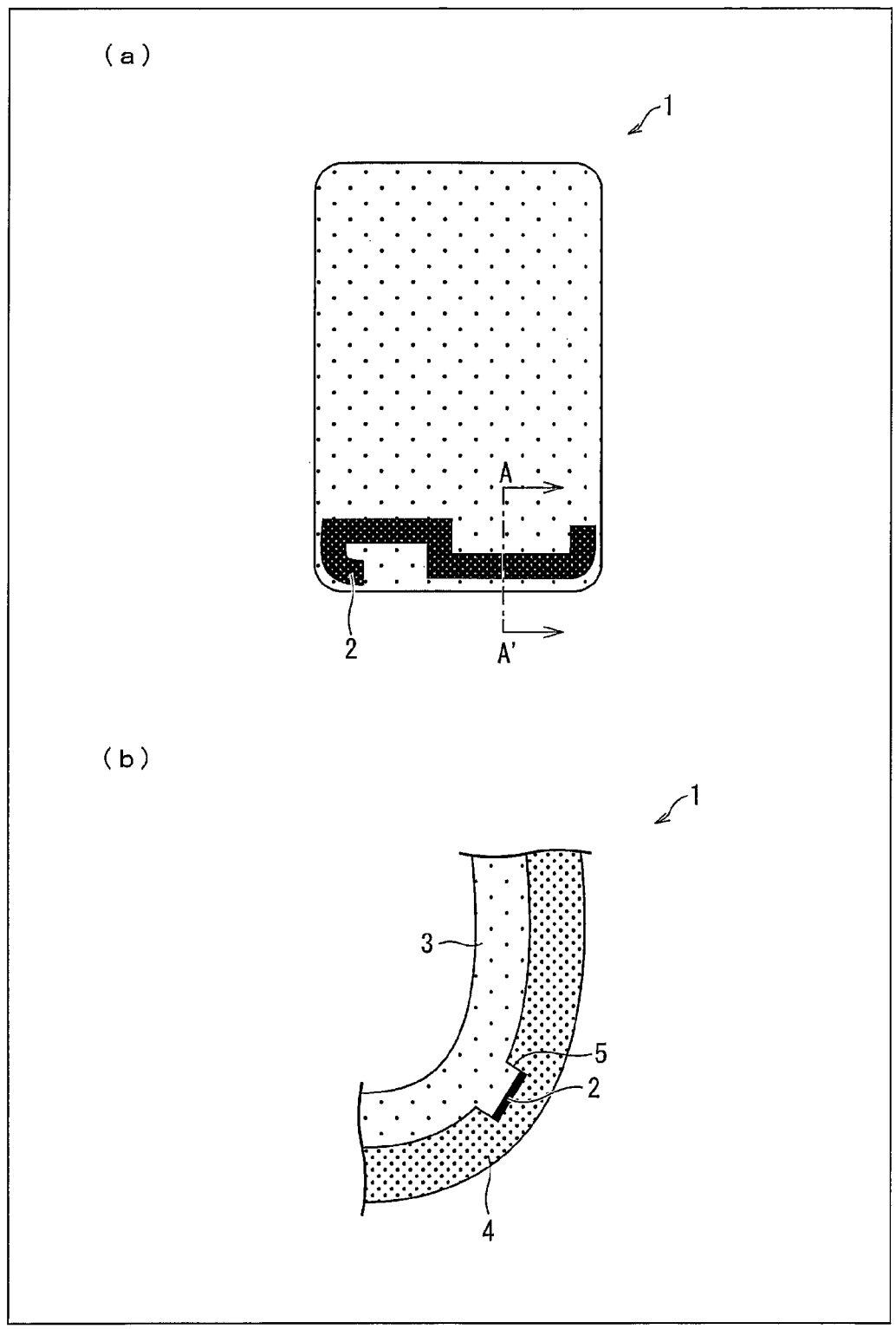
FIG. 1 schematically illustrates a configuration of a structure in accordance with an embodiment of the present invention. (a) of FIG. 1 illustrates a cross section of the structure which cross section is taken along a surface on which an electrically conductive pattern is formed. (b) of FIG. 1 illustrates a cross section viewed along arrows A-A' in (a) of FIG. 1.

A structure in accordance with a first embodiment is described below with reference to FIG. 1. FIG. 1 schematically illustrates a configuration of a structure 1 in accordance with the first embodiment. (a) of FIG. 1 illustrates a cross section of the structure 1 which cross section is taken from a surface on which an electrically conductive pattern is formed. (b) of FIG. 1 illustrates a cross section viewed along arrows A-A' in (a) of FIG. 1. Note that for description, (b) of FIG. 1 illustrates an electrically conductive pattern 2 included in the structure 1.

As illustrated in (b) of FIG. 1, the structure 1 in accordance with the first embodiment includes the electrically conductive pattern 2, a first resin layer 3, and a second resin layer 4. According to the structure 1, the electrically conductive pattern 2 is formed on the first resin layer 3, and a housing is configured by stacking the second resin layer 4 on the first resin layer 3 so that the electrically conductive pattern 2 is provided between the first resin layer 3 and the second resin layer 4.

(Step Part)

Note here that the first resin layer 3 is provided with a step part 5 formed in conformity with a shape of at least part of the electrically conductive pattern 2, and the first resin layer 3 and the second resin layer 4 closely adhere to each other in the step part 5. The step part 5 refers to, for example, a step produced in a case where the first resin layer 3 partially protrudes (rises) toward the second resin layer 4, or is partially recessed (depressed) so as to face away from the second resin layer 4. Specifically, the step part 5 refers to side walls of a protruding part or a recessed part.

FIG. 2 schematically illustrates a cross section of the structure 1. (a) through (d) of FIG. 2 illustrate variations of the step part 5 which can be formed on the first resin layer 3.

As illustrated in (a) of FIG. 2, it is possible to provide the step part 5 which is formed in conformity with edges on both sides of the electrically conductive pattern 2 (i.e., one edge part and the other edge part of a contour of the electrically conductive pattern 2) and protrudes toward the second resin layer 4. In this case, a protruding part formed by the step part 5 so as to protrude toward the second resin layer 4 is provided on the first resin layer 3. The electrically conductive pattern 2 is provided on the protruding part.

As illustrated in (b) of FIG. 2, it is also possible to provide the step part 5 which is formed in conformity with the edges on both sides of the electrically conductive pattern 2 and is recessed so as to face away from the second resin layer 4. In this case, a recessed part formed by the step part 5 so as to face away from the second resin layer 4 is provided on the first resin layer 3. The electrically conductive pattern 2 is provided on the recessed part.

Alternatively, as illustrated in (c) and (d) of FIG. 2, it is also possible to provide the step part 5 which is formed in conformity with either one of the edges on both sides of the electrically conductive pattern 2. In this case, a protruding part ((c) of FIG. 2) or a recessed part ((d) of FIG. 2) formed by the step part 5 is provided on the first resin layer 3. The electrically conductive pattern 2 is provided on the protruding part or the recessed part.

The electrically conductive pattern 2 is provided on the first resin layer 3 which is provided with the step part 5 described earlier, and the second layer 4 is stacked on the first resin layer 3 so that the electrically conductive pattern 2 is provided between the first resin layer 3 and the second resin layer 4. Note here that the first resin layer 3 and the second resin layer 4 closely adhere to each other in at least part of the step part 5 provided on the first resin layer 3. That is, the electrically conductive pattern 2 is not provided in at least part of the step part 5, and thus the electrically conductive pattern 2 does not exist between the first resin layer 3 and the second resin layer in that part.

With the configuration, the step part 5 provided on the first resin layer 3 allows an increase in area of contact between the first resin layer 3 and the second resin layer 4. As a result, the first resin layer 3 and the second resin layer 4 increase in adhesion strength. This makes it possible to avoid separation of the second resin layer 4 and the electrically conductive pattern 2 at an interface therebetween. Since it is possible to avoid separation of the second resin layer 4 and the electrically conductive pattern 2 at the interface therebetween, there is no fear of a drift of a resonance frequency at which the electrically conductive pattern 2 operates.

In addition, the electrically conductive pattern 2 which extends more widely causes a further decrease in area of contact between the first resin layer 3 and the second resin layer 4. However, according to the first embodiment, the step part 5 provided on the first resin layer 3 causes an increase in area of contact between the first resin layer 3 and the second resin layer 4. This prevents the first resin layer 3 and the second resin layer 4 from decreasing in adhesion strength, so that it is possible to avoid separation of the first resin layer 3 and the second resin layer 4 at the interface therebetween.

(Distance Between Electrically Conductive Pattern and Step Part)

While the electrically conductive pattern 2 is being formed on the protruding part or the recessed part formed by the step part 5 provided on the first resin layer 3, a production error occurs depending on a method for forming the electrically conductive pattern 2 (e.g., an LDS method or a printing method), and the electrically conductive pattern 2 may be unnecessarily formed on the step part 5 (i.e., side walls of the protruding part or the recessed part). In view of this, in order to avoid such unnecessary forming of the electrically conductive pattern on the step part 5, it is preferable to provide, in a part in which the step part 5 is provided in conformity with the shape of at least part of the electrically conductive pattern 2, a space between the step part 5 and the electrically conductive pattern 2. FIG. 3 schematically illustrates a cross section of the structure 1 in which the space is provided between the step part 5 and the electrically conductive pattern 2 in the part in which the step part 5 is provided in conformity with the shape of at least part of the electrically conductive pattern 2. (a) through (d) of FIG. 3 illustrate variations of the step part 5 that can be formed on the first resin layer 3.

For example, in (a) of FIG. 3, the step part 5 which is formed in conformity with the edges on both sides of the electrically conductive pattern 2 and protrudes toward the second resin layer 4 is provided on the first resin layer 3. The electrically conductive pattern 2 is formed on a protruding part formed by the step part 5 so as to protrude toward the second resin layer 4. In this case, it is preferable that a space X1 and a space X2 be each provided between an edge part of the part in which the step part 5 is provided in conformity with the shape of at least part of the electrically conductive pattern 2 and an edge part of a part of the electrically conductive pattern 2 which part corresponds to the edge part of the part in which the step part 5 is provided in conformity with the shape of at least part of the electrically conductive pattern 2.

In (b) of FIG. 3, the step part 5 which is formed in conformity with the edges on both sides of the electrically conductive pattern 2 and is recessed so as to face away from the second resin layer 4 is provided on the first resin layer 3. On the first resin layer 3, the electrically conductive pattern 2 is formed on a recessed part formed by the step part 5 so as to face away from the second resin layer 4. In this case, it is preferable that a space X3 and a space X4 be each provided between an edge part of the part in which the step part 5 is provided in conformity with the shape of at least part of the electrically conductive pattern and an edge part of a part of the electrically conductive pattern 2 which part corresponds to the edge part of the part in which the step part 5 is provided in conformity with the shape of at least part of the electrically conductive pattern.

In (c) and (d) of FIG. 3, it is possible to provide, on the first resin layer 3, the step part 5 which is formed in conformity with either one of the edges on both sides of the electrically conductive pattern 2. On the first resin layer 3, the electrically conductive pattern 2 is formed on a protruding part ((c) of FIG. 3) or a recessed part ((d) of FIG. 3) formed by the step part 5. In this case, it is preferable that a space X5 and a space X6 be each provided between an edge part of the part in which the step part 5 is provided in conformity with the shape of at least part of the electrically conductive pattern 2, and an edge part of a part of the electrically conductive pattern 2 which part corresponds to the edge part of the part in which the step part 5 is provided in conformity with the shape of at least part of the electrically conductive pattern 2.

It is preferable that the space X1 to the space X6 each have a size that is more than 0 (zero) mm and not more than a width of the electrically conductive pattern 2. According to the configuration, even in a case where a production error occurs while the electrically conductive pattern 2 is being formed on the protruding part or the recessed part formed by the step part 5 provided on the first resin layer 3, a part of the electrically conductive pattern 2 which part is shifted closer to the step part 5 side is formed in a region falling within the space X1 to the space X6. This makes it possible to avoid unnecessarily forming of the electrically conductive pattern on the step part 5 (side surfaces of the protruding part or the recessed part). This also suitably allows the first resin layer 3 and the second resin layer 4 to increase in adhesion strength around the electrically conductive pattern 2.

Note that the above description discusses the configuration in which the electrically conductive pattern 2 is formed on the protruding part or the recessed part formed by the step part 5. However, the present invention is not necessarily limited to such a configuration. For example, the electrically conductive pattern 2 can be formed continuously from the protruding part to the recessed part. In this case, the electrically conductive pattern 2 is also formed on the step part (i.e., side surfaces of the protruding part or the recessed part). However, at least part of the step part 5 is in contact with the second resin layer 4. Provided that at least part of the step part 5 is thus in contact with the second resin layer 4, the electrically conductive pattern 2 can be formed on any one of the protruding part and the recessed part each formed by the step part 5, and the step part 5.

(Method for Producing Structure)

As described earlier, according to the structure 1, the electrically conductive pattern 2 is formed on the first resin layer 3, and thereafter the second resin layer 4 is stacked on the first resin layer 3 so that the electrically conductive pattern 2 is provided between the first resin layer 3 and the second resin layer 4. The following description discusses, with reference to FIG. 4, a specific method for producing the structure 1. FIG. 4 schematically illustrates a process for producing the structure 1. (a) of FIG. 4 illustrates a step of forming the step part 5 on the first resin layer 3. (b) of FIG. 4 illustrates a step of forming the electrically conductive pattern 2 on the first resin layer 3. (c) of FIG. 4 illustrates a step of stacking the second resin layer 4 on the first resin layer 3 on which the electrically conductive pattern 2 is provided.

As illustrated in (a) of FIG. 4, the first resin layer 3 on which the step part 5 is provided is formed by injection molding by use of a mold. In (a) of FIG. 4, the step part 5 is formed in conformity with edges on both sides of the electrically conductive pattern 2 (one edge part and the other edge part of a cross section of the electrically conductive pattern 2).

Subsequently, as illustrated in (b) of FIG. 4, the electrically conductive pattern 2 is formed, by use of the method described earlier, on the protruding part or the recessed part formed by the step part 5. In this case, the electrically conductive pattern 2 is formed so that at least part of the step part 5 is in contact with the second resin layer 4, which is to be stacked on the first resin layer 3 later. In (b) of FIG. 4, the electrically conductive pattern 2 is formed on the protruding part formed by the step part 5 so as to protrude toward the second resin layer 4.

Then, as illustrated in (c) of FIG. 4, on the first resin layer 3 on which the electrically conductive pattern 2 is formed, the second resin layer 4 is stacked so that the electrically conductive pattern 2 is provided between the first resin layer 3 and the second resin layer 4. Specifically, the second resin layer 4 is insert-molded with respect to the first resin layer 3 on which the electrically conductive pattern 2 is formed. In this case, the second resin layer 4 is provided with a step part corresponding to the step part 5 provided on the first resin layer 3 in advance, i.e., a step part that fits the step part 5 provided on the first resin layer 3. This causes the step part 5 provided on the first resin layer 3 to closely adhere to the step part provided in the second resin layer 4.

Second Embodiment

Next, a configuration in which a structure in accordance with the present invention is incorporated in an electronic device is described below. The following description of a second embodiment takes, as an example, a configuration in which the structure in accordance with the present invention is incorporated in a wireless communication apparatus. As described earlier, an electrically conductive pattern can be used as an antenna element. In this case, the structure in accordance with the present invention can be incorporated in a wireless communication apparatus that includes an antenna element as an electrically conductive pattern. Note, however, that the present invention is not limited to such a configuration. The structure can be incorporated in an electronic device different from a wireless communication apparatus.

A wireless communication apparatus in accordance with the second embodiment is described below with reference to FIG. 5. FIG. 5 schematically illustrates a configuration of a wireless communication apparatus 10a that includes a structure 1a in accordance with the second embodiment.

As illustrated in FIG. 5, the wireless communication apparatus 10a includes the structure 1a and an internal device 11. The structure (upper housing) 1a and a lower housing 12 constitute a housing of the wireless communication apparatus 10a. The structure 1a is configured as in the case of the structure 1 in accordance with the first embodiment except the electrically conductive pattern is replaced with an antenna element (electrically conductive pattern) 2a. The internal device 11 includes a mounting component 6, an internal substrate 7, and an electronic circuit section (wireless circuit section) 8. The internal substrate 7 is a substrate on which to mount the mounting component 6 and the electronic circuit section 8 each for carrying out various functions of the wireless communication apparatus 10a. Note that the electronic circuit section 8 is electrically connected to the antenna element 2 via, for example, a feeding spring (not illustrated).

According to the wireless communication apparatus 10a in accordance with the second embodiment, a second resin layer 4 is stacked on a first resin layer 3 so as to be closer to an outside of the housing of the wireless communication apparatus 10a than the first resin layer 3, and a step part 5 is provided so that a region of the first resin layer 3 in which region at least part of the antenna element 2a is provided protrudes toward the second resin layer 4. In other words, the antenna element 2 is provided on a part which protrudes so as to face away from the internal device 11.

The configuration allows a distance Y between the antenna element 2a and the internal device 11 to be long. In a case where the distance Y between the antenna element 2a and the internal device 11 is short, the internal device 11 which is seen as a GND from the antenna element 2a may be in proximity to the antenna element, or the antenna element 2a may be combined with the internal equipment 11 and produce unnecessary resonance. This may cause a deterioration in antenna characteristic. However, the second embodiment allows the distance Y between the antenna element 2a and the internal device 11 to be long. This can prevent the internal device 11 from being seen as a GND from the antenna element 2a, and avoid combination of the antenna element 2a with the internal device 11 and production of unnecessary resonance, so that a deterioration in antenna characteristic can be prevented.

Third Embodiment

FIG. 6 schematically illustrates a configuration of a wireless communication apparatus 10b in accordance with a third embodiment of the present invention. (a) of FIG. 6 illustrates a cross section of the wireless communication apparatus 10b which cross section is taken along a surface on which an electrically conductive pattern (antenna element) is formed. (b) of FIG. 6 illustrates a cross section viewed along arrows B-B' in (a) of FIG. 6. Note that for description, (b) of FIG. 6 illustrates an antenna element 2b included in a structure 1b.

As illustrated in (b) of FIG. 6, the wireless communication apparatus 10b includes the structure 1b and an internal device 11. The structure (upper housing) 1b and a lower housing 12 constitute a housing of the wireless communication apparatus 10b. The internal device 11 includes a mounting component 6, an internal substrate 7, an electronic circuit section (wireless circuit section) 8, and an electrically conductive member 9. The electrically conductive member 9 is, for example, a feeding spring, which is a member for electrically connecting the electronic circuit section 8 and the antenna element 2b.

According to the wireless communication apparatus 10b, a first resin layer 3 is located with respect to a second resin layer 4 so as to be closer to an outside of the housing of the wireless communication apparatus 10b than the second resin layer 4. In other words, the second resin layer 4 is stacked on the first resin layer 3 so as to be closer to the electronic circuit section 8 than the first resin layer 3. A step part 5 is provided so that a region of the first resin layer 3 in which region part of the antenna element 2b is provided protrudes toward the second resin layer 4 and is through the second resin layer 4. In other words, a part of the first resin layer 3 which part is formed by the step part 5 so as to protrude toward the second resin layer 4 is through the second resin layer 4. The part thus protruding is provided with a feeding point for the electronic circuit 8 to supply electric power to the antenna element 2b (a contact point at which to electrically connect the antenna element 2b and the electronic circuit 8).

As illustrated in (a) of FIG. 6, the part of the first resin layer 3 which part is formed by the step part 5 so as to protrude toward the second resin layer 4 (a region Z) has a cylindrical shape. As illustrated in (b) of FIG. 6, the part thus protruding and having a cylindrical shape is through the second resin layer 4 and is exposed.

The antenna element 2b, which is provided on at least the protruding part described above, is continuously provided so as to extend from the protruding part to a recessed part of the cylindrical shape. In this case, the antenna element 2b is also provided on a part of the step part 5 (i.e., side surfaces of the protruding part or the recessed part), whereas the other part of the step part 5 is in contact with the second resin layer 4.

The feeding spring (electrically conductive member 9) is connected to the antenna element 2b exposed from the second resin layer 4 and provided on the first resin layer 3 (i.e., on the protruding part). That is, the feeding point for the antenna element 2b is provided on the protruding part described above.

The step part 5 which is thus provided in conformity with a shape of a vicinity of the feeding point, which is highly important for the antenna element 2b, allows the first resin layer 3 and the second resin layer 4 to increase in adhesion strength around the feeding point for the antenna element 2b. This allows the antenna element 2b and the second resin layer 4 to closely adhere to each other at a substantially constant degree in the vicinity of the feeding point, so that a variation in antenna characteristic can be prevented.

The present invention is not limited to the description of the embodiments above, but may be altered by a skilled person within the scope of the claims. An embodiment based on a proper combination of technical means disclosed in different embodiments is encompassed in the technical scope of the present invention.

CONCLUSION

A structure (1) in accordance with an aspect of the present invention having a first resin layer (3) and a second resin layer (4), includes: an electrically conductive pattern (2) provided on a surface of the first resin layer, the second resin layer being provided on the first layer so that the electrically conductive pattern is provided between the first resin layer and the second resin layer, the first resin layer being provided with a step part (5) formed in conformity with a shape of at least part of the electrically conductive pattern, and the first resin layer and the second resin layer closely adhering to each other in the step part.

According to the configuration, since the step part is provided in conformity with the electrically conductive pattern, an area of contact between the first resin layer and the second resin layer around the electrically conductive pattern is made larger. As a result, the first resin layer and the second resin layer increase in adhesion strength around the electrically conductive pattern. This can prevent separation of the second resin layer and the electrically conductive pattern at an interface therebetween.

The structure in accordance with an aspect of the present invention may be configured such that in a part in which the step part is provided in conformity with the electrically conductive pattern, a space that is not more than a width of the electrically conductive pattern is provided between the electrically conductive pattern and the step part.

According to the configuration, even in a case where a production error occurs while the electrically conductive pattern is being formed on a protruding part or a recessed part formed by the step part provided on the first resin layer, a part of the electrically conductive pattern which part is shifted closer to the step part side is formed in a region falling within the space. This makes it possible to avoid unnecessarily forming of the electrically conductive pattern on the step part (side surfaces of the protruding part or the recessed part). This also suitably allows the first resin layer and the second resin layer 4 to increase in adhesion strength around the electrically conductive pattern.

A wireless communication apparatus (10a, 10b) in accordance with an aspect of the present invention includes: a housing including the structure in accordance with an aspect of the present invention; and an antenna including the electrically conductive pattern.

According to the configuration, it is possible to prevent separation of the second resin layer and the electrically conductive pattern at an interface therebetween. This can prevent a drift of a resonance frequency at which the antenna operates.

The wireless communication apparatus in accordance with an aspect of the present invention may be configured such that: the second resin layer is stacked on the first resin layer so as to be closer to an outside of the housing than the first resin layer; and the step part is provided so that a region of the first resin layer in which region at least part of the electrically conductive pattern is provided protrudes toward the second resin layer.

The configuration allows a distance between an internal device stored in the wireless communication apparatus and the electrically conductive pattern to be long. This can prevent the internal device which is seen as a GND from the electrically conductive pattern serving as an antenna from being in proximity to the electrically conductive pattern, and can avoid combination of the electrically conductive pattern with the internal device and production of unnecessary resonance, so that a deterioration in antenna characteristic can be prevented.

The wireless communication apparatus in accordance with an aspect of the present invention may be configured to further include: a wireless circuit section (8), the second resin layer being stacked on the first resin layer so as to be closer to the wireless circuit section than the first resin layer, the step part being provided so that a region of the first resin layer in which region part of the electrically conductive pattern is provided protrudes toward the second resin layer and is through the second resin layer, and the region being provided with a feeding point for the wireless circuit section to supply electric power to the electrically conductive pattern.

According to the configuration, the step part is provided in conformity with a shape of a vicinity of the feeding point, which is highly important for an antenna element (the electrically conductive pattern). Therefore, the first resin layer and the second resin layer can increase in adhesion strength around the feeding point for the antenna element. This allows the antenna element and the second resin layer to closely adhere to each other at a substantially constant degree in the vicinity of the feeding point, so that a variation in antenna characteristic can be prevented.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention is usable in the field of production of (i) a structure including an electrically conductive pattern and (ii) a wireless communication apparatus including the structure.

REFERENCE SIGNS LIST

1 Structure
1a, 1b Structure (Upper housing)
2 Electrically conductive pattern
2a, 2b Antenna element (Electrically conductive pattern)

3 First resin layer
4 Second resin layer
5 Step part
6 Mounting component
7 Internal substrate
8 Electronic circuit section
9 Electronically conductive member
10a, 10b Wireless communication apparatus
11 Internal device
12 Lower housing

The invention claimed is:

1. A wireless communication apparatus comprising a structure having a first resin layer and a second resin layer, comprising:
 an electrically conductive pattern provided on a surface of the first resin layer,
 the second resin layer being provided on the first layer so that the electrically conductive pattern is provided between the first resin layer and the second resin layer,
 the first resin layer being provided with a step part formed in conformity with a shape of at least part of the electrically conductive pattern, and
 the first resin layer and the second resin layer are welded together in the step part to increase adhesion strength between the first and second resin layers,
 said apparatus comprising a housing and an antenna including the electrically conductive pattern,
 a wireless circuit section,
 the second resin layer being stacked on the first resin layer so as to be closer to the wireless circuit section than the first resin layer,
 the step part being provided so that a region of the first resin layer in which region part of the electrically conductive pattern is provided protrudes toward the second resin layer and is through the second resin layer, and
 the region being provided with a feeding point for the wireless circuit section to supply electric power to the electrically conductive pattern.

2. The structure as set forth in claim 1, wherein in a part in which the step part is provided in conformity with the electrically conductive pattern, a space that is not more than a width of the electrically conductive pattern is provided between the electrically conductive pattern and the step part.

* * * * *